United States Patent
Nishimura

(10) Patent No.: US 7,439,525 B2
(45) Date of Patent: Oct. 21, 2008

(54) DEMAGNIFICATION MEASUREMENT METHOD FOR CHARGED PARTICLE BEAM EXPOSURE APPARATUS, STAGE PHASE MEASUREMENT METHOD FOR CHARGED PARTICLE BEAM EXPOSURE APPARATUS, CONTROL METHOD FOR CHARGED PARTICLE BEAM EXPOSURE APPARATUS, AND CHARGED PARTICLE BEAM EXPOSURE APPARATUS

(75) Inventor: Shinsuke Nishimura, Higashiyamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 11/501,824

(22) Filed: Aug. 10, 2006

(65) Prior Publication Data

US 2006/0284110 A1    Dec. 21, 2006

Related U.S. Application Data

(62) Division of application No. 10/742,778, filed on Dec. 23, 2003, now Pat. No. 7,095,035.

(30) Foreign Application Priority Data

Dec. 27, 2002    (JP)    ............................ 2002-382394

(51) Int. Cl.
    *G21K 5/10*    (2006.01)
(52) U.S. Cl. .............. 250/491.1; 250/492.3; 250/492.1; 250/492.2; 250/492.22
(58) Field of Classification Search ............... 250/491.1
    See application file for complete search history.

(56) References Cited

U.S. PATENT DOCUMENTS

| 5,830,612 | A | * | 11/1998 | Yamada et al. | ................. 430/30 |
| 5,912,467 | A | * | 6/1999 | Okino | ..................... 250/491.1 |
| 5,912,469 | A | * | 6/1999 | Okino | .................... 250/492.23 |
| 5,973,333 | A | | 10/1999 | Nakasuji et al. | |
| 6,111,646 | A | * | 8/2000 | Naulleau et al. | ............. 356/494 |
| 6,331,885 | B1 | * | 12/2001 | Nishi | .......................... 355/53 |
| 2004/0026634 | A1 | * | 2/2004 | Utsumi et al. | .......... 250/492.23 |

FOREIGN PATENT DOCUMENTS

JP    7-22349    1/1995

* cited by examiner

*Primary Examiner*—Jack I. Berman
*Assistant Examiner*—Andrew Smyth
(74) *Attorney, Agent, or Firm*—Oblon, Spivak, McClelland, Maier & Neustadt, P.C.

(57) ABSTRACT

A method for measuring a demagnification of a charged particle beam exposure apparatus includes measuring a first stage position of a mask stage in accordance with a mask stage coordinate system, irradiating a first charged particle beam to a first irradiation position on a specimen through the opening portion of the mask, measuring the first irradiation position in accordance with a specimen stage coordinate system, moving the mask stage to a second stage position, measuring the second stage position of the mask stage, irradiating a second charged particle beam to a second irradiation position on the specimen through the opening portion of the mask measuring the second irradiation position in accordance with the specimen stage coordinate system, and calculating a demagnification of the charged particle beam exposure apparatus from the first and second stage positions and the first and second irradiation positions.

2 Claims, 4 Drawing Sheets

XY: Specimen stage coordinate system
Xm, Ym: Mask stage coordinate system

DEMAGNIFICATION MEASUREMENT METHOD FOR CHARGED PARTICLE BEAM EXPOSURE APPARATUS, STAGE PHASE MEASUREMENT METHOD FOR CHARGED PARTICLE BEAM EXPOSURE APPARATUS, CONTROL METHOD FOR CHARGED PARTICLE BEAM EXPOSURE APPARATUS, AND CHARGED PARTICLE BEAM EXPOSURE APPARATUS

CROSS-REFERENCE TO RELATED APPLICATIONS

This application is a divisional of application Ser. No. 10/742,778 filed. Dec. 23, 2003 and claims the benefit of priority from the prior Japanese Patent Application No. 2002-382394, filed Dec. 27, 2002, the entire contents of which are incorporated herein by reference.

BACKGROUND OF THE INVENTION

1. Field of the Invention

The invention relates to lithography using a charged particle beam. More specifically, the invention relates to a stage phase measurement method for a charged particle beam exposure apparatus for measuring the phase of a mask stage coordinate system for a specimen stage coordinate system of a charged particle beam exposure apparatus; a demagnification measurement method for a charged particle beam exposure apparatus for measuring the demagnification for image projection onto a mask specimen surface; a control method for a charged particle beam exposure apparatus for performing control corresponding the measured phase and demagnification; and a charged particle beam exposure apparatus.

2. Description of the Related Art

With increasingly fined semiconductor devices, studies and research are being made regarding charged particle beam exposure apparatuses for exposure patterns.

Demagnification lenses and objective lenses are used to demagnify and transferring a mask pattern onto a specimen. The mask pattern is demagnified by these lenses and the pattern is rotated by a magnetic field, so that the phase of the pattern to be transferred onto the surface of the specimen is varied concurrently with deflection in demagnification. The apparatus is designed by taking both the rotation and the demagnification into account, and the apparatus is designed so that the rotation is performed at a desired demagnification. Practically, however, design errors and manufacture errors disable obtaining the condition concurrently allowing the desired demagnification and the desired rotation to be exhibited. A process for measuring the demagnification and pattern rotation angle is disclosed in Jpn. Pat. Appln. KOKAI Publication No. 7-22349.

A rotational error of the pattern is correctable by using a rotation stage that carries the mask. However, since no means is provided to correct the movement direction of a mask stage X and the movement direction of a mask stage Y, the system phase of the mask stage coordinate system remains mismatched with the specimen stage coordinate system.

Because of assembly errors, design errors, and lens system adjustment errors, the mask stage coordinate system has errors for the specimen stage coordinate system; and generally, it does not have means for adjusting the errors. While an XY mask stage should be mounted to one more θ stage to adjust the phase of an XY mask stage, since the construction is thereby complexed and free space in an electrooptical housing is insufficient, it is difficult to mount the XY mask stage. When moving a desired mask pattern with the mask stage to the vicinity of the beam, if such errors as those described above are zero, the movement position can be determined in accordance with pattern design values. However, a problem arises in that an accurate movement position of the pattern cannot be known, so that accurate movement cannot be implemented.

Regarding a demagnification measurement method, using a design distance D between two opening portions provided in the mask and a distance d between individual beam specimen surface positions formed in the opening portions, the demagnification has been obtained by way of "demagnification M=d/D". However, errors such as those occurring in the manufacture of the opening portions and distortion undesirably influence the calculation result. In a case where the manufacture error is 50 nm and the distance between the opening portions is 500 μm, the case results in causing an error of 0.01% (50 nm/500 μm×100). When performing scan-exposure of a 300 μm mask pattern by using the demagnification, there arises the problem of causing an image-dimensional error of as large as 30 nm (i.e., 300 μm×0.01%=30 nm).

Further, a problem arises in that an accurate pattern cannot be imaged onto the specimen since no method is available to measure the phase of the mask stage coordinate system with respect to the problem of demagnification measurement errors and the specimen stage coordinate system.

BRIEF SUMMARY OF THE INVENTION

A demagnification measurement method for a charged particle beam exposure apparatus, according to an aspect of the present invention, comprises: measuring a first stage position of a mask stage of the charged particle beam exposure in accordance with a mask stage coordinate system with an opening portion of a mask placed on the mask stage being situated in a first opening position; irradiating a first charged particle beam to a first irradiation position on a surface of a specimen through the opening portion of the mask, the first charged particle beam being shaped through the opening portion and then passing through an objective lens system; measuring the first irradiation position in accordance with a specimen stage coordinate system; moving the mask stage to a second stage position to situate the opening portion of the mask in a second opening position different from the first opening position; measuring the second stage position of the mask stage in accordance with the mask stage coordinate system; irradiating a second charged particle beam to a second irradiation position on the surface of the specimen through the opening portion of the mask moved together with the mask stage, the second charged particle beam being shaped through the opening portion situated in the second opening position and then passing through an objective lens system; measuring the second irradiation position in accordance with the specimen stage coordinate system; and calculating a demagnification of the objective lens system from the first and second stage positions and the first and second irradiation positions.

A stage phase measurement method for a charged particle beam exposure apparatus, according to another aspect of the present invention, comprises: measuring a rotation angle of a pattern of a charged particle beam shaped through a mask placed on a mask stage of the charged particle beam exposure apparatus and then irradiated on a surface of a specimen through an objective optical system; correcting rotation of the pattern by rotating the mask corresponding to the measured rotation angle; measuring a first stage position of the mask stage in accordance with a mask stage coordinate system after correcting the rotation with an opening portion of the mask being situated in a first opening position; irradiating a first charged particle beam to a first irradiation position on the surface of the specimen through the opening portion of the mask, the first charged particle beam being shaped through the opening portion and then passing through an objective lens system; measuring the first irradiation position in accordance with a specimen stage coordinate system; moving the mask stage to a second stage position to situate the opening portion in a second opening position different from the first opening position; measuring the second stage position of the mask stage in accordance with the mask stage coordinate system; irradiating a second charged particle beam to a second irradiation position on the surface of the specimen through the opening of the mask moved together with the mask stage, the second charged particle beam shaped through the opening portion situated in the second opening position and then passing through the objective lens system; measuring the second irradiation position in accordance with a specimen stage coordinate system; and calculating a phase difference between the specimen stage coordinate system and the mask stage coordinate system from the first and second stage positions and the first and second irradiation positions.

A control method for a charged particle beam exposure apparatus, according to another aspect of the present invention, comprises: measuring a first stage position of a mask stage of the charged particle beam exposure apparatus in accordance with a mask stage coordinate system with an opening portion of a mask placed on the mask stage being situated in a first opening position; irradiating a first charged particle beam to a first irradiation position on a surface of a specimen through the opening portion of the mask, the first charged particle beam being shaped through the opening portion situated in the first opening position and then passing through an objective lens system of the exposure apparatus; measuring a first irradiation position in accordance with a specimen stage coordinate system; moving the mask stage to a second stage position to situate the opening portion in a second opening position different from the first opening position; measuring the second stage position of the mask stage in accordance with the mask stage coordinate system; irradiating a second charged particle beam to a second irradiation position on the surface of the specimen through the opening portion of the mask moved together with the mask stage, the second charged particle beam being shaped through the opening portion situated in the second opening position and then passing through the objective lens system; measuring the second irradiation position in accordance with a specimen stage coordinate system; and obtaining a demagnification of the objective lens system from the first and second stage positions and the first and second irradiation positions; adjusting the demagnification of the objective lens system corresponding to the obtained demagnification; measuring a rotation angle of a pattern of the charged particle beam shaped through the mask and then irradiated on the surface of the specimen via the objective optical system, after the adjusting; correcting the rotation of the pattern by rotating the mask corresponding to the measured rotation angle; measuring a third stage position of the mask stage in accordance with a mask stage coordinate system after correcting the rotation with the opening portion of the mask being situated in a third opening position; irradiating a third charged particle beam to a third irradiation position on the surface of the specimen through the opening portion situated in the third opening position, the third charged particle beam being shaped through the opening portion situated in the third opening position and then passing through an objective lens system; measuring the third irradiation position in accordance with a specimen stage coordinate system; moving the mask stage to a fourth stage position to situate the opening portion in a fourth opening position different from the third opening position; measuring the fourth stage position of the mask stage in accordance with the mask stage coordinate system; irradiating a fourth charged particle beam to a fourth irradiation position on the surface of the specimen through the opening portion situated in the fourth opening position, the fourth charged particle beam being shaped through the opening portion situated in the fourth opening position and then passing through the objective lens system; measuring the fourth irradiation position in accordance with a specimen stage coordinate system; and obtaining a phase difference between the specimen stage coordinate system and the mask stage coordinate system from the third and fourth stage positions and the third and fourth irradiation positions; and moving the mask stage by correction in accordance with the phase difference.

A charged particle beam exposure apparatus according to another aspect of the present invention, comprises: a radiating unit configure to radiate a charged particle beam; an XY mask stage on which a mask having an opening is placed and which moves the mask stage in X and Y directions of a mask stage coordinate system; a mask stage measuring unit configured to measure a position of the XY mask stage in accordance with the mask stage coordinate system; a deflector which deflects the charged particle beam and changes the position of the charged particle beam on a surface of the mask; an objective lens system which demagnifies a pattern of the charged particle beam shaped through the mask and irradiates the specimen with the charged particle beam; a specimen stage on which the specimen is placed and which moves the specimen in X and Y directions of a specimen stage coordinate system; an objective deflector which deflects the charged particle beam and changes the position of the charged particle beam on a surface of the specimen; an irradiation position measuring unit configure to measure an irradiation position of the charged particle beam on the surface of the specimen in accordance with the specimen stage coordinate system; and a demagnification measuring unit configure to measure a demagnification of the objective lens system on the basis of two positions of the XY mask stage measured at different opening positions respectively and a position of the charged particle beam on the surface of the specimen that was shaped through the opening of each of the opening positions.

A charged particle beam exposure apparatus according to another aspect of the present invention, comprises: a radiate unit configure to radiate a charged particle beam; an XY mask stage on which a mask having an opening is placed and which moves the mask in X and Y directions of a mask stage coordinate system; a θ mask stage which rotates the mask in an XY plane of the mask stage coordinate system; an opening position measuring unit configure to measure a position of the opening in accordance with the mask stage coordinate system; a deflector which deflects the charged particle beam and changes the position of the charged particle beam on a surface of the mask; an objective lens system which demagnifies a pattern of the charged particle beam shaped through the mask and irradiates a specimen with the charged particle beam; a specimen stage on which the specimen is placed and which moves the specimen in X and Y directions of a specimen stage coordinate system; an objective deflector which deflects the charged particle beam and changes the position of the charged particle beam on a surface of the specimen; an irradiation position measuring unit configure to measure an irradiation position of the charged particle beam on the surface of the specimen in accordance with the specimen stage coordinate system; a rotation angle measuring unit configure to measure a rotation angle of the pattern of the charged particle beam in the objective lens system; a phase measuring portion configure to measure a phase of the mask stage coordinate system with respect to the specimen stage coordinate system based on a position of the XY mask stage measured at two opening positions respectively and a position of the charged particle beam on the surface of the specimen that was shaped through the opening of each of the opening positions; and a driving unit configure to drive the XY mask stage and the θ mask stage corresponding to the measured phase.

DETAILED DESCRIPTION OF THE INVENTION

An embodiment according to the present invention will be described herein below with reference to the drawings.

Figure 1:
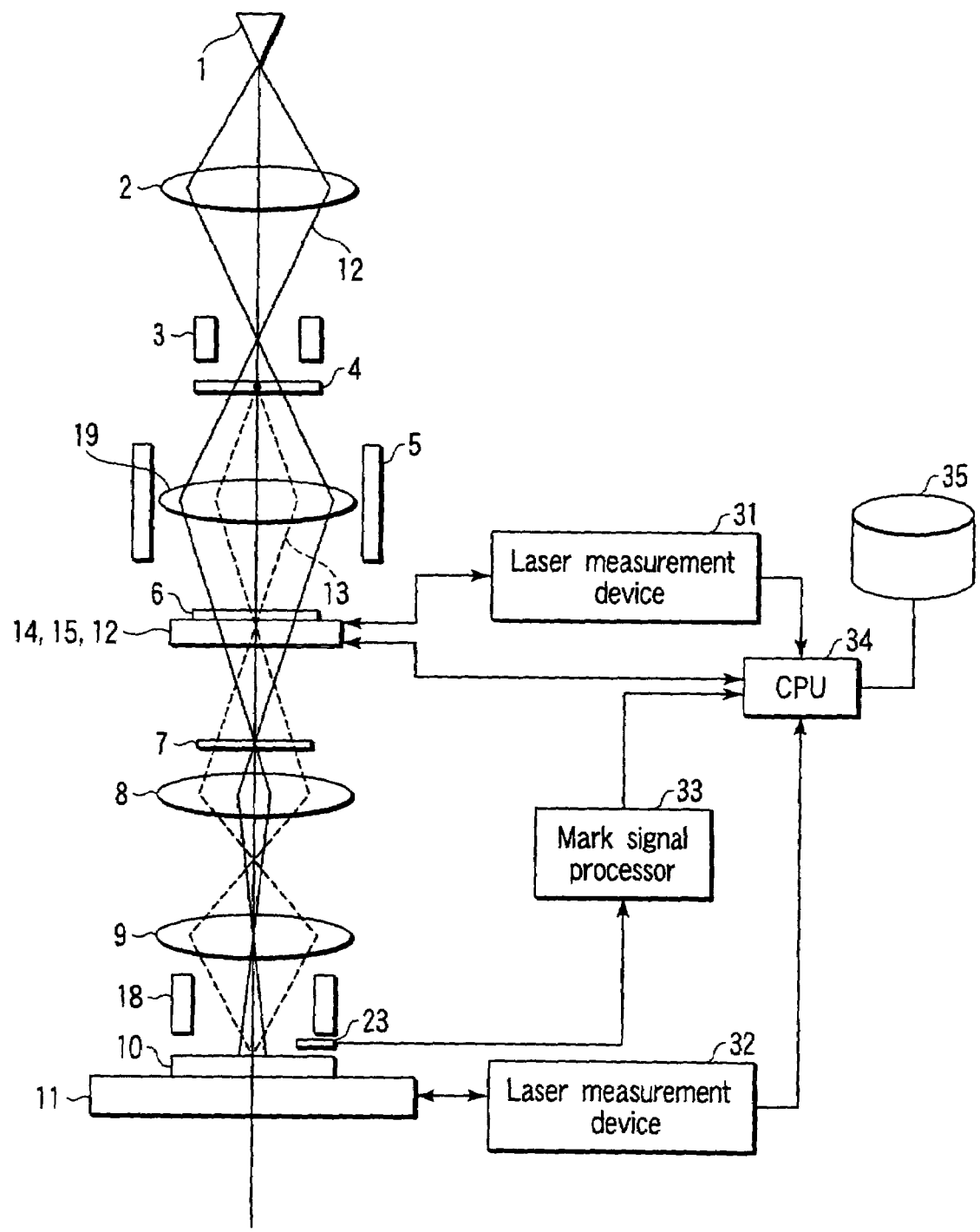
FIG. 1 is a schematic configuration diagram showing an electron beam exposure apparatus according to an embodiment of the present invention.

FIG. 1 is a schematic configuration diagram showing an electron beam exposure apparatus according to the embodiment of the present invention. A beam emitted from an electron gun 1 is imaged through an illumination lens 2, a projection lens 19, and a demagnification lens (objective lens system) 8, and is finally imaged on a main surface of an objective lens (objective lens system) 9. An image of a first shaping aperture 4 is formed onto a mask 6, and an image thus formed is created on the specimen surface through the demagnification lens 8 and the objective lens 9.

An opening portion 21 is provided in the first shaping aperture 4. The dimensional shape of the opening portion 21 is a rectangle having one side of 80 μm, for example. The electron beam emitted from the electron gun 1 can be deflected through a blanking deflector 3, and the beam position on the first shaping aperture 4 can thereby be changed.

Figure 2:
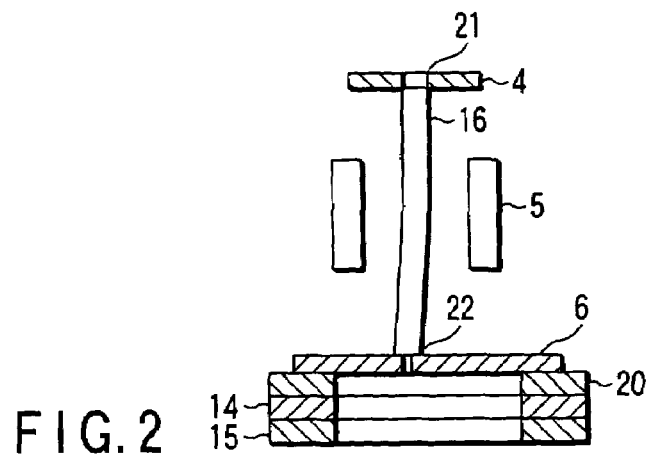
FIG. 2 is a view showing in detail a portion of the electron beam exposure apparatus shown in FIG. 1.
Figure 3:
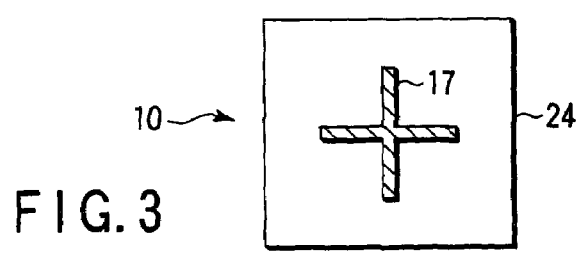
FIG. 3 is a plan view showing the construction of a marking table of the electron beam exposure apparatus shown in FIG. 1.

Referring to FIG. 2, the mask 6 is mounted over a θ stage 20, and the θ stage 20 is mounted on an X stage 14 and a Y stage 15, whereby the mask 6 can be moved. The mask 6 is moved by the X stage 14 and the Y stage 15 in X and Y directions. The positions of the X stage 14 and the Y stage 15 are under positional control of a laser measurement apparatus (laser interferometer) 31. An opening portion 22 is provided in the mask 6, as shown in FIG. 2. In accordance with programs stored in a storage medium 35, a CPU 34 acquires the position of the opening portion 22 from the measurement result of the laser measurement device 31. The dimensional shape of the opening portion 22 is smaller than the size of the first shaping aperture image formed on the mask 6. The dimensional shape of the opening portion 22 is a rectangle having one side of 40 μm, for example. The electron beam shaped through the opening portion 21 of the first shaping aperture can be deflected through a shaping deflector 5, and the beam position on the mask 6 can thereby be changed. The beam passed through the objective lens 9 can be deflected by an objective deflector 18. A marking table 10 is provided on an XY specimen stage 11 and is movable in the X and Y directions in the specimen stage coordinate system. The position of the XY specimen stage 11 is under positional control of a laser measurement device (laser interferometer) 32. As shown in FIG. 3, a cross mark 17 provided on the marking table 10 is made from a beam-reflecting material different from a material of a base 24. For example, the base 24 is made of silicon, whereas the mark 17 is made of a material such as gold or tungsten, for example. The beam position on the marking table 10 can be changed by the objective deflector 18. A beam detector 23 detects electrons reflected from the marking table 10 and secondary electrons.

A function is provided that moves the mark 17 to the optical axis position, scans the electron beam to be projected onto the mark 17 by using the objective deflector 18, and then detects the irradiation position of the electron beam in accordance with the distance between the mark and the electron beam, which has been obtained through calculation performed by taking a signal detected by the beam detector 23 into a mark signal processor 33 and a stage position measurement value of the laser measurement device 32. The CPU 34 executes the above-described function in accordance with programs stored in the storage medium 35. In FIG. 1, reference numeral 17 denotes an objective aperture, reference numeral 12 denotes a lens imaging system, and reference numeral 13 denotes a shaped-image imaging system 13.

A mask stage phase measurement method and an objective-lens-system demagnification measurement method according to the present embodiment will now be described hereinbelow by using FIGS. 4A, 4B, and 5. The mask stage phase measurement and the objective-lens-system demagnification measurement are executed by the CPU 34 in accordance with programs stored in the storage medium 35. Also, control of the X, Y, and θ mask stages 14, 15, and 20 corresponding to the measurement results is executed by the CPU 34 in accordance with programs stored in the storage medium 35.

When measuring a mask stage phase, a rotation angle θmp of the mask pattern formed through the demagnification lens 8 and the objective lens 9 is preliminarily measured. The θ stage 20 is driven in accordance with the measurement result to bring the mask pattern into to the state in which it is not rotated on the specimen. A method of measuring a mask-pattern rotation angle as θmp is described in, for example, Jpn. Pat. Appln. KOKAI Publication No. 7-22349. However, the measurement of the rotation angle θmp is not necessary in the event of obtaining only the demagnification.

The opening portion 22 on the mask 6 is moved to a position A by using the shaping deflector. The positions of the X mask stage 14 and the Y mask stage 15 are measured by a laser measurement device in accordance with the mask stage coordinate system, and the position A of the opening portion 22 is measured from the results thereof. The electron beam shaped through the first shaping aperture opening portion 21 is deflected by the shaping deflector 5 to the opening portion 22 on the mask. The electron beam is deflected to a position where the opening portion 22 is covered overall, as shown in FIG. 4A. The electron beam shaped through the opening portion 22 arrives at a position "a", as shown in FIG. 4B. The position "a" is measured by a mark scan process performed in accordance with the specimen stage coordinate system. The mark scan process is described in, for example, reference document (S. Nishimura: Jpn. J. Appl. Phys. Vol. 36 (1997), pp. 7517-7522: Evaluation of Shaping Gain Adjustment Accuracy Using Atomic Force Microscope in Variably Shaped Electron-Beam Writing Systems) and Jpn. Pat. Appln. KOKAI Publication No. 10-270337.

Figure 4A:
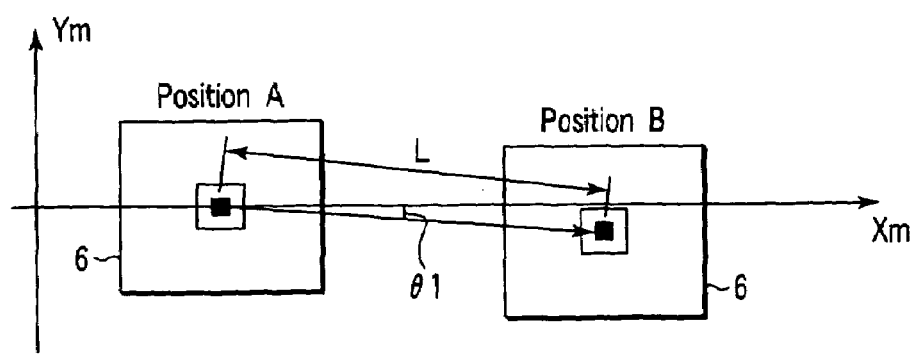
FIGS. 4A and 4B are views used to explain a mask stage phase measurement method and a demagnification measurement method for an objective lens system.
Figure 4B:
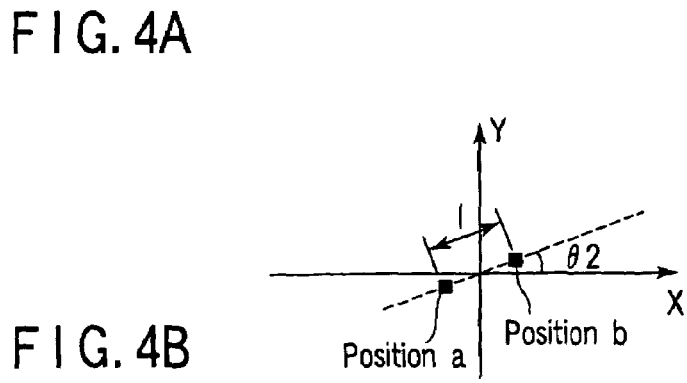
Figure 5:
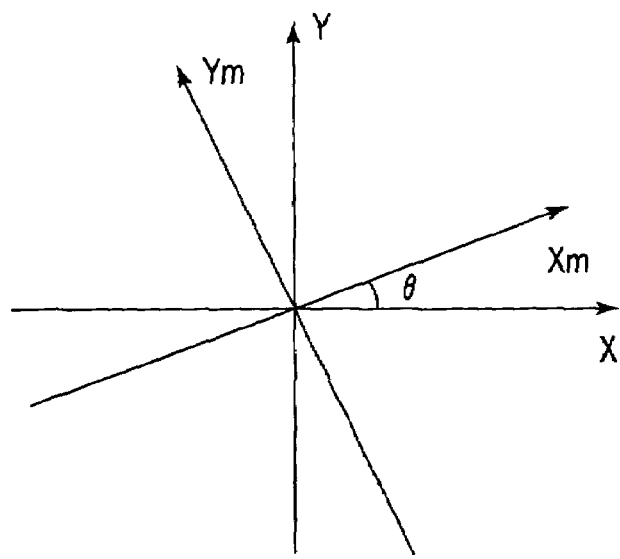
FIG. 5 is a view showing phases of a mask stage coordinate system for a specimen stage coordinate system.

Subsequently, the opening portion 22 of the mask 6 is moved to a position B (FIG. 4A). The positions of the X mask stage 14 and the Y mask stage 15 are measured by a laser measurement device in accordance with the mask stage coordinate system, and the position B is measured from the results thereof. The electron beam is deflected by the shaping deflector to the opening portion 22 in the position B. The beam shaped through the opening portion 22 is then irradiated to a position b (FIG. 4B) on the specimen. In a manner similar to the above, the position b is measured by the mark scan process in accordance with the specimen stage coordinate system. The electron beam is irradiated to the two positions without altering the settings of the demagnification lens 8, the objective lens 9, and the objective deflector 18.

The distance between the position A and the position B of the opening portion on the mask 6 is represented by L. Likewise, the distance between the beam position "a" and the beam position b of each specimen surface is represented by l. In this case, the relationship can be expressed as "demagnification $\eta=l/L$."

In addition, the phase difference between a line segment connecting between the position A and the position B and an Xm axis of the mask stage coordinate system is represented by $\theta 1$. Likewise, the phase difference between a line segment connecting between the position "a" and the position b and the X axis of the specimen stage coordinate system is represented by $\theta 2$. In this case, a phase $\theta$ of the mask stage coordinate system for the specimen stage coordinate system can be expressed as "$\theta 2 - \theta 1$" (FIG. 5).

The phase differences $\theta 1$ and $\theta 2$ are thus obtained based on the Xm axis and the X axis. However, the phase differences $\theta 1$ and $\theta 2$ may be obtained based on a Ym axis and the Y axis. Still alternatively, the phase differences $\theta 1$ and $\theta 2$ may be obtained based on straight lines having the same tilts in the individual coordinate systems. In addition, according to the above description, the opening positions A and B are individually obtained. However, only the positions of the X mask stage 14 and the Y mask stage 15 may be measured by the laser measurement device in the state in which the opening portions are individually situated in the opening positions A and B. The positional relationship between the two opening positions can be known and the distances and phase differences can be obtained from the X mask stage 14 and the Y mask stage 15 in the individual opening positions.

The positions of the X mask stage 14 and the Y mask stage 15 can be accurately obtained. In the present embodiment, the measurement is performed by way of measurement of the positions of the X mask stage 14 and the Y mask stage 15, so that the measurements are each obtained with a measurement accuracy of 1 nm or less (accuracy of an actual measurement device recently used). Accordingly, also the measurement accuracy of the distance L of each of the positions A and B is 1 nm or less. When the distance L is 500 μm, the error is 50 nm in the conventional case. However, in the present invention, the measurement can be implemented with the accuracy of 1 nm or less, so that the demagnification measurement error is 0.0002% (1 nm/500 μm×100). Therefore, in the case where a pattern of 300 μm is imaged on the mask, a linewidth accuracy or positional accuracy of 0.6 nm (i.e., 300 μm×0.0002× 0.01=0.6 nm) can be implemented.

Where the measurement accuracy of the irradiation position "a" and the irradiation position b is 1 nm (measurement accuracy of a recent exposure apparatus) and the distance is 50 μm, the phase measurement error is 1/50,000 rad (=0.02 mrad). Where the movement amount of the mask stage is 100 mm, the difference at both ends is as extremely small as 2 μm (100 mm×0.02/1,000). As such, the positional movement accuracy of the pattern on the mask 6 is exhibited with a high value of 2 μm. Further, since the differing phase is corrected and the mask stage is moved, when exposure is performed while the mask stage is being moved, the overall deflection range of Y of the shaping deflection becomes effectively usable as a scan width.

Figure 6:
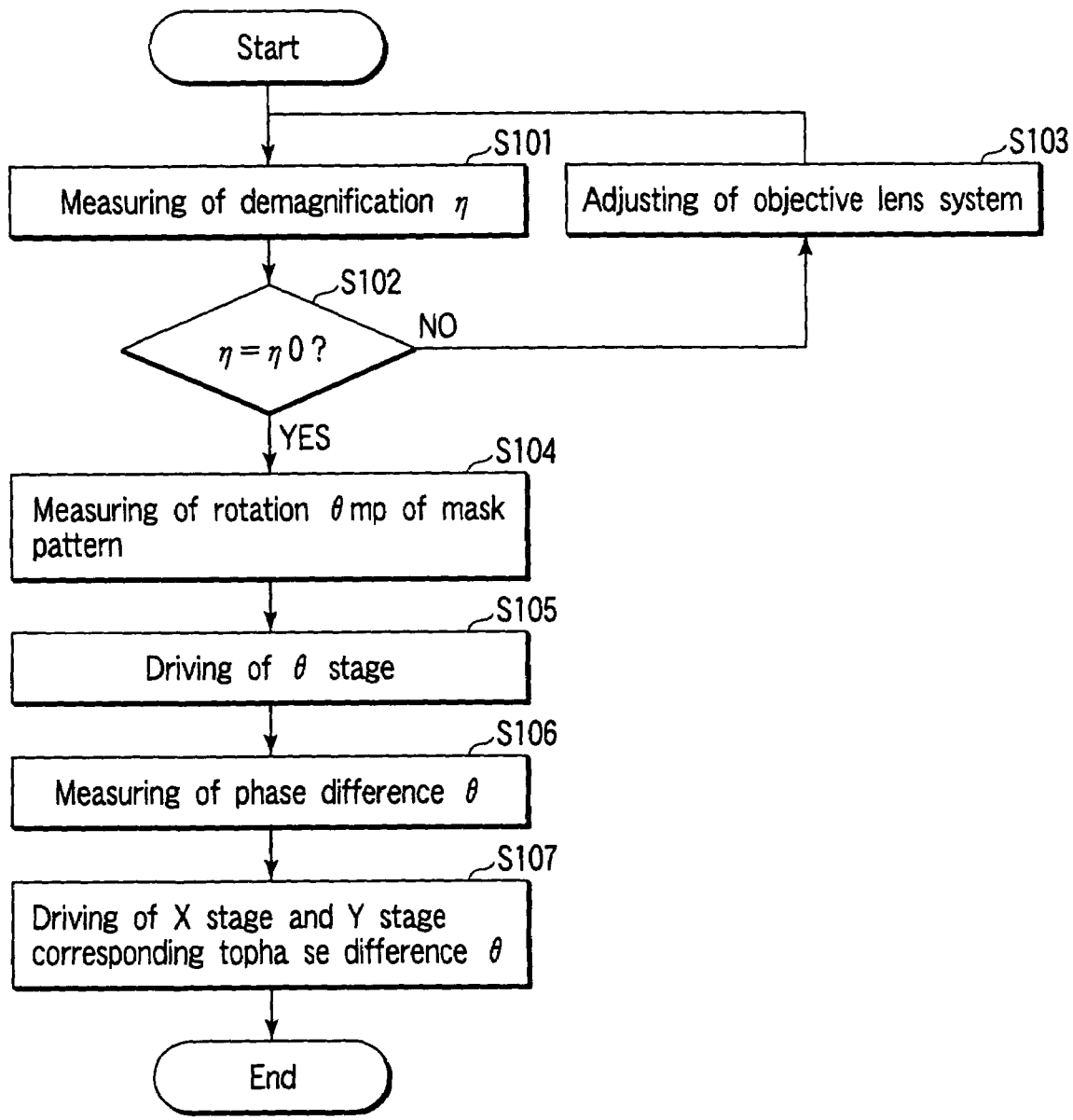
FIG. 6 is a flowchart showing a control method for a charged particle beam exposure apparatus.

A control method for the charged particle beam exposure apparatus, which is configured by combining the above-described demagnification measurement and the stage phase measurement will now be described hereinbelow with reference to FIG. 6.

Using the method described above, processing is performed to measure a demagnification $\eta$ (step S101). Then, the measured demagnification $\eta$ is compared with a desired demagnification $\eta_0$ (step S102). If the result is not $\eta=\eta_0$, the lens system is adjusted so that the desired demagnification can be obtained (step S103). If the measured demagnification $\eta$ has become the demagnification $\eta_0$, processing proceeds to next step S104. The arrangement may be such that if a required demagnification has reached an allowable error range, processing shifts to next step S104.

Using a well known process, processing is performed to measure a rotation angle $\theta$mp of a pattern of an electron beam that has been shaped through a mask and has traveled through the objective lens system (step S104). The process to be used to measure the rotation angle $\theta$mp is selected from those of the type that does not rely on the phase difference between the mask stage coordinate system and the specimen stage coordinate system. Then, the $\theta$ stage 20 is driven corresponding to the rotation angle $\theta$mp, and the rotation of the pattern is thereby corrected (step S105).

Subsequently, using the above-described method, processing is performed to measure a phase $\theta$ of the specimen stage coordinate system for the mask stage coordinate system (step S106).

When moving the mask stage, after correction is made corresponding to the phase $\theta$, and the mask stage is moved (step S107). Where the mask pattern coordinate system is based on (Xm, Ym) and the mask stage coordinates are based on (X, Y), moving the mask stage to satisfy the following relationship enables the mask stage to be moved in conformity with the phase of the specimen stage:

$$\Delta X = \Delta Xm \times \cos\theta + \Delta Ym \times \sin\theta$$

$$\Delta Y = \Delta Ym \times \cos\theta - \Delta Xm \times \sin\theta$$

By performing the movement correction of the XY mask stage, the mask can be moved to an accurate position. Then, by performing adjustment of the demagnification, correction of the rotation angle of the pattern, and movement correction of the mask stage according to the phase $\theta$, the pattern can be accurately imaged on the specimen.

The present invention is not limited to the embodiment described above. While having been described by reference to the exemplified electron beam exposure apparatus, the present invention can be adapted also to an ion beam exposure apparatus. In addition, while the stage position is measured by the laser interferometer, there is no limitation thereto; and any other devices may be used as long as they are capable of defining the stage coordinates with high accuracy.

Figure 7:
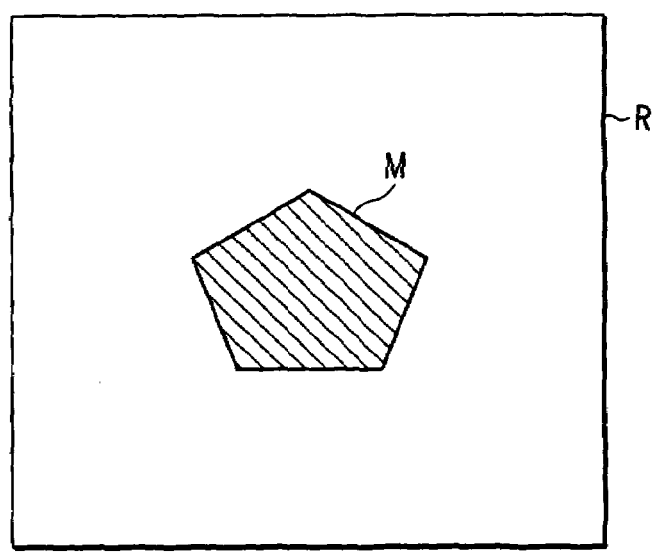
FIG. 7 is a view used to explain a method of measuring an irradiation position of an electron beam.

The process of measuring the irradiation position of the electron beam is not limited to the mark scan process. For example, as shown in FIG. 7, a process is available in which scan is performed with an electron beam over a mark M sized smaller than a scan range, and the center of gravity of a screen-image object is obtained to thereby measure the beam position. The mark M may be arbitrary, as shown in FIG. 7. A range R larger than the mark M is beam-scanned to thereby obtain data of the screen-image object. The beam position can be obtained by obtaining the data of the screen-image object. The present invention can be practiced by making various other changes without departing from the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for measuring a stage phase in a charged particle beam exposure apparatus, comprising:

measuring a rotation angle of a pattern of a charged particle beam shaped through a mask placed on a mask stage of the charged particle beam exposure apparatus and then irradiated on a surface of a specimen through an objective optical system;

correcting rotation of the pattern by rotating the mask corresponding to the measured rotation angle;

measuring a first stage position of the mask stage in accordance with a mask stage coordinate system after correcting the rotation with an opening portion of the mask being situated in a first opening position;

irradiating a first charged particle beam to a first irradiation position on the surface of the specimen through the opening portion of the mask, the first charged particle beam being shaped through the opening portion and then passing through an objective lens system;

measuring the first irradiation position in accordance with a specimen stage coordinate system;

moving the mask stage to a second stage position to situate the opening portion in a second opening position different from the first opening position;

measuring the second stage position of the mask stage in accordance with the mask stage coordinate system;

irradiating a second charged particle beam to a second irradiation position on the surface of the specimen through the opening of the mask moved together with the mask stage, the second charged particle beam shaped through the opening portion situated in the second opening position and then passing through the objective lens system;

measuring the second irradiation position in accordance with a specimen stage coordinate system; and calculating a phase difference between the specimen stage coordinate system and the mask stage coordinate system from the first and second stage positions and the first and second irradiation positions.

2. A method according to claim 1, further comprising:

moving the mask stage by correction corresponding to the phase difference obtained by the calculating.

* * * * *